United States Patent [19]

Nishizawa

[11] 4,338,618

[45] Jul. 6, 1982

[54] COMPOSITE STATIC INDUCTION TRANSISTOR AND INTEGRATED CIRCUIT UTILIZING SAME

[75] Inventor: Jun-ichi Nishizawa, Sendai, Japan

[73] Assignee: Zaidan Hojin Handotai Kenkyu Shinkokai, Sendai, Japan

[21] Appl. No.: 90,496

[22] Filed: Nov. 1, 1979

Related U.S. Application Data

[63] Continuation-in-part of Ser. No. 902,965, May 4, 1978, Pat. No. 4,198,648.

[30] Foreign Application Priority Data

May 15, 1977 [JP] Japan .................................. 52-55778

[51] Int. Cl.³ ............................................. H01L 27/02
[52] U.S. Cl. .................................... 357/43; 357/22; 357/41; 357/46; 357/50; 357/55; 357/92
[58] Field of Search ....................... 357/22, 41, 46, 43, 357/50, 55, 92

[56] References Cited

PUBLICATIONS

Jap. Pat. Prel. Pub. No. Sho 52-9384.
Jap. Pat. Prel. Pub. No. Sho 51-81583.
Electronics Materials (Denshi Zairyo) Mar. 1977, pp. 6-7.

*Primary Examiner*—Edward J. Wojciechowicz
*Attorney, Agent, or Firm*—Cushman, Darby & Cushman

[57] ABSTRACT

A composite junction-gate static induction transistor comprising a main static induction transistor (SIT) having a source, a gate and a drain, and an auxiliary static induction transistor having an auxiliary source connected to the source of the main SIT, an auxiliary gate connected to the gate of same SIT and an auxiliary drain connected to the auxiliary gate. An input signal current is applied to the composite gate and charges it up to a certain level, and thereafter it may flow through the auxiliary static induction transistor. Therefore, minority carrier storage in the junction-gate static induction transistor can be greatly reduced.

18 Claims, 9 Drawing Figures

COMPOSITE STATIC INDUCTION TRANSISTOR AND INTEGRATED CIRCUIT UTILIZING SAME

CROSS REFERENCE TO RELATED APPLICATION

This is a continuation-in-part of my copending application Ser. No. 902,965 filed May 4, 1978, now U.S. Pat. No. 4,198,648 issued Apr. 15, 1980.

BACKGROUND OF THE INVENTION (a) Field of the Invention

The present invention is related to an integrated semiconductor device, and more particularly it pertains to a Static Induction Transistor (SIT) device.

(b) Description of the Prior Art

A junction-gate static induction transistor is a unipolar transistor similar to a junction gate field effect transistor. For example, an n-channel junction-gate field effect transistor comprises an n+ type semiconductor source region for supplying current-forming electrons, a drain region for retrieving electrons supplied from the source region, an n− type semiconductor channel region disposed between the source and the drain regions, and a p+ type semiconductor gate region disposed adjacent to the channel region. The channel region of the static induction transistor has a low impurity concentration and a short length, as compared with those of usual field effect transistors, so that the depletion region extending from the gate-channel junction can pinch off the channel region to form a potential barrier, which barrier may be called an intrinsic gate. The height of the barrier can be controlled by the drain voltage as well as by the gate voltage. Reduction of this barrier height by the drain voltage leads to unsaturating drain I-V characteristics in cooperation with the small source-to-intrinsic gate resistance. The low impurity concentration of the channel region provides remarkable advantages represented by low parasitic capacitance and high operation speed.

When the gate of the static induction transistor is reverse biased, no carrier injection occurs from the gate to the channel, and only the majority carriers move in the channel region.

When the gate of the static induction transistor is forward biased, the gate-channel junction is forwardly biased, and minority carriers can be injected into the channel region from the gate region. Such minority carriers may enhance the turn-on operation to some extent but will lower the speed of the turn-off operation.

The minority carrier storage effect due to the carriers injected from the control electrode becomes a serious problem when the control circuit for the control electrode has some excessive carrier-supplying ability, i.e. when the control circuit still supplies carriers even after the control electrode of the static induction transistor has attained a high forward potential for turning the static induction transistor on. This becomes more pronounced in the case of an IIL type circuit where the inverter or driver transistor is driven by a constant current source transistor.

A Static Induction Transistor Logic device (SITL device), which is a unique modification of the conventional IIL device employing bipolar transistors to serve as the injector and the driver, respectively, has been proposed, for example, in Japanese Patent Application No. 50-146588 (corresponding U.S. Patent Application Ser. No. 748292/1976 by Jun-ichi NISHIZAWA), and Japanese Patent Application No. 51-92467 (corresponding U.S. Patent Application Ser. No. 819343/1977 by Jun-ichi NISHIZAWA et al.) now abandoned. The basic arrangement of such SITL device is shown in an equivalent circuit in FIG. 1. As shown, the SITL device has a bipolar transistor $Q_1$ serving as the injector and a static induction transistor $Q_2$ serving as the driver. The collector of the injector transistor $Q_1$ is coupled to the gate of the driver transistor $Q_2$, and the base of the injector transistor $Q_1$ and the source of the driver transistor $Q_2$ are mutually coupled together. In the usual operation of this SITL device, a constant potential $V_{EE}$ is applied to the emitter of the injector $Q_1$, and the source of the driver transistor $Q_2$ is grounded. This SITl device will operate in a manner similar to that of the conventional IIL device employing bipolar transistors as injector and driver, but is far superior to the conventional IIL device in many respects, as will be described below.

Firstly, the static induction transistor serving as the driver $Q_2$, basically, is a majority carrier control device and therefore is significantly less subject to the so-called minority carrier storage effect which contributes to limiting the switching speed of the driver transistor in the conventional ILL device. Consequently, the SITL device can provide a much higher speed in switching operation as compared with that of the conventional IIL device.

Secondly, the static induction transistor, basically, is a voltage-controlled device, so that only a small amount of power is required to drive driver transistor and the driver transistor can be easily coupled to the output of the preceding stage circuit. Also, the power loss in the driver transistor itself is small. Accordingly, the SITL device will allow a high-density integration.

Thirdly, the static induction transistor as the driver has a large transconductance and can provide an increased number of fan-outs. As a result, the SITL device can perform any required logical operation with a simple circuit arrangement.

Fourthly, the SITL device has the advantage that it is simple in construction and can be easily formed into a high integration density by a simple manufacturing process, as will be explained below with reference to FIGS. 2 and 3.

Figure 1:
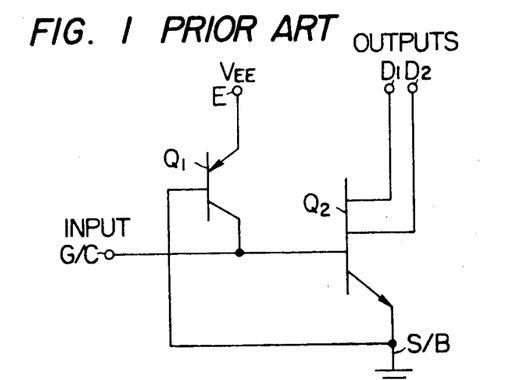
FIG. 1 is a circuit diagram showing an equivalent circuit of an SITL device of the prior art.
Figure 2:
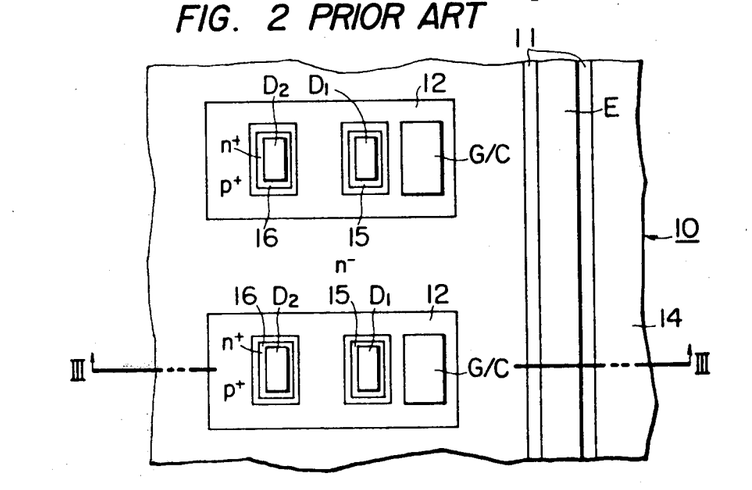
FIG. 2 is a diagrammatic top plan view of an example of an integrated SITL device of the prior art.
Figure 3:
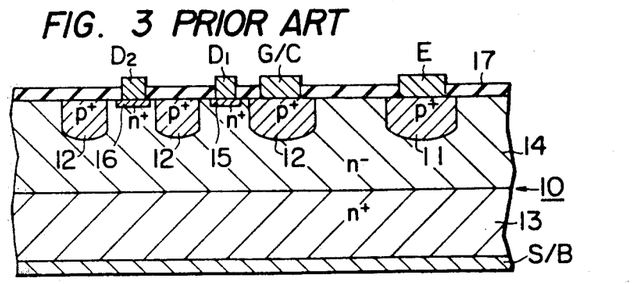
FIG. 3 is a diagrammatic vertical sectional view taken along the line III—III in FIG. 2.

An example of the basic structure of an integrated SITL device as mentioned above is illustrated in a top plan view in FIG. 2 and is also known in FIG. 3 in a vertical section taken along the line III—III of FIG. 2. The SITL includes a semiconductor wafer 10 consisting of a heavily doped n+ type substrate 13 and a lightly doped n− layer 14. In the semiconductor layer 14 a heavily doped p+ type region 11, and a heavily doped p+ type region 12 of a mesh-like shape are provided. In upper portions of the layer 14 (in those portions surrounded by the region 12) there are provided heavily doped n+ type regions 15 and 16. The regions 11, 12 and a portion of the layer 14 which is sandwiched between the regions 11 and 12 jointly constitute a lateral bipolar transistor serving as an injector transistor $Q_1$ as shown in FIG. 1. In further detail, the region 11 functions as an emitter; the region 12 functions as a collector; and the sandwiched portion of the layer 14 functions as the base. On the other hand, the layers 12, 13, 14, 15 and 16 form, jointly therewith, a static induction transistor serving as a driver transistor $Q_2$ as shown in FIG. 1. More particularly, the substrate 13 functions as a source; the region 12 functions as a gate; and the regions 15 and 16 functions as respective drains. The current channels of the static induction transistor are defined to be those portions of the layer 14 which are surrounded by the region 12. There are provided, on the corresponding locations, drain electrodes $D_1$ and $D_2$, a gate/collector electrode G/C, an emitter electrode E, and a source/base electroe S/B. A passivation film layer 17, such as a silicon dioxide film, a silicon nitride film layer and so on, is formed on the exposed upper surface of the semiconductor wafer 10.

As will be easily understood from FIGS. 2 and 3, the SITL device can be manufactured by relying on a simple processing technique wherein the impurity diffusion step is conducted only two times, and four masks are required at most, for instance.

With such a simple structure as well as such a simple process, there has been obtained an integrated SITL device whose power.delay product for low current operation is decreased to as low as 0.002 pJ or less. Furthermore, a specimen of such SITL device exhibiting a minimized delay time of 13.8 nanoseconds or less in an operation with a power dissipation of 230 microwatts has been reduced to practice according to the structure of FIGS. 2 and 3. In this specimen, the semiconductor layer 14 has an impurity concentration of about $10^{14}$ atoms/cm$^3$ and a thickness of about 6 micrometers, the gate region 12 has an impurity concentration of about $10^{17}$ atoms/cm$^3$ or more and a thickness of about 2 micro-meters, and the gate mask distance is set to be about 6 micro-meters. The above-mentioned delay time of the SITL device is due to several factors, such as a delay for charging up the gate capacitance of the driver transistor, a delay for carrier transit across the source and the drain of the driver transistor, a carrier storage effect due to unnecessary minority carriers injected from the gate into a high resistivity region around the gate other than the current channel of the drive transistor, a carrier storage effect due to excessive minority carriers injected from the gate into the current channel, and like factors. The former three delay factors may be reduced drastically, by minimizing the thickness of the high resistivity layer 14 (see FIG. 3) to thereby bring the gate 12 into a substantial contact with the low resistivity layer 13 and thereby to reduce the effective distance between the source and the drains 15 and 16, and by minimizing the effective area of the gate 12, for instance. The provision of an insulator region at the output boundary of the driver gate may be effective for preventing the occurrence of an unnecessary carrier injection at the boundary. The last factor may also be somewhat reduced by a decrease in the gate area. In this manner, a specimen of the SITL device has been produced having delay time as small as 4 nanoseconds or less.

The afore-mentioned excellent operating characteristics of the SITL device can not be attained by the conventional IIL device, particularly when the conventional IIL device is designed to provide many fan-outs. Some known modified IIL device comprised of only bipolar transistors, such as the known VIL (Vertical Injection Logic) device and SSL (Self-Aligned Super Injection Logic) device, might be seen as being somewhat comparable to the SITL device only in the delay time characteristic (representative minimum delay time is 8 nanoseconds), but their power.delay product is roughly thirty times or more as large as that of the SITL device. Moreover, these known modified IIL devices are extremely complicated in structure and fairly hard to manufacture as compared with the SITL device.

The SITL device has many excellent features as mentioned above, but still may be improved with respect to the minority carrier storage effect developed in the static induction transistor serving as the driver transistor of the SITL device. This minority carrier storage effect is caused by excessive minority carriers injected into the current channel from the gate when the driver transistor is in the conductive state. More particularly, the current which is supplied by the injector transistor, after having charged the gate capacitance of the driver transistor up to a required potential, continues to flow. This charges the gate capacitance up to an excessively high potential, because the injector current is usually kept substantially constant. As a result, the gate junction of the driver transistor is deeply forward-biased, so that an excessively large amount of carriers are injected, thus bringing about the above-described carrier storage effect. Since a static induction transistor, basically, is a majority carrier control device, the degree of the minority carrier storge effect developing at the current channel of the static function transistor serving as the driver is very low as compared with that in a bipolar transistor. However, the carrier storage effect constitutes a great obstruction in attaining a further increase in the operating speed of the SITL device.

Figure 4:
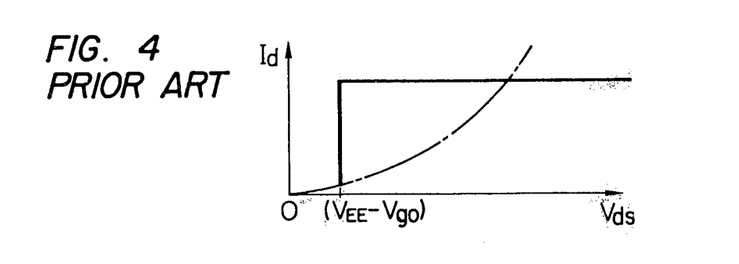
FIG. 4 is a chart for explaining a problem encountered during the attempts of improving the operating characteristics of the prior art SITL device.

Such minority carrier storage effect at the current channel in the driver static induction transistor might be eliminated by replacing the injector bipolar transistor in the SITL device by a static induction transistor, as proposed in Japanese Patent Application No. 52-4633 (corresponding U.S. Patent Application Ser. No. 867298/1978 by Jun-ichi NISHIZAWA), and in Japanese Patent Application NO. 52-15879 in which the inventor is Jun-ichi NISHIZAWA. Suppose that the device to be employed as the injector transistor has an ideal drain-source voltage $V_{ds}$ versus drain current $I_d$ characteristic such as shown by the solid line in FIG. 4, in which the drain current $I_d$ is maintained at a desirable minimized value, after the gate potential of the driver transistor has exceeded a predetermined potential $V_{go}$ necessary to render the driver transistor conductive. When an injector transistor has such characteristic as stated just above, the undesirable excessive minority carrier injection in the driver transistor can be suppressed, and thus the carrier storage effect is greatly reduced. In addition, if the injector static induction transistor is able to supply a sufficiently large amount of drain current $I_d$ to quickly charge the gate capacitance of the driver transistor up to said potential $V_{go}$, a sufficiently high speed turning-on operation could be performed by the driver transistor. It should be noted, however, that an actual static induction transistor has such a drain-source voltage versus drain current characteristic as shown by the dash-and-dot line in FIG. 4. Namely, as the gate capacitance of the driver transistor is being charged up with the injector drain current and as, thus, the gate potential of the driver transistor (together with the drain potential of the inejctor transistor) is being pulled up, the drain current of the injector transistor will tend to gradually decrease because of its decreasing drain-source voltage. For this reason, practically speaking, it is impossible to accomplish both the elimination of the excessive minority carrier injection and the quick charging-up of the gate capacitance of the driver transistor, at the same time by replacing the injector with a static induction transistor in an SITL device.

SUMMARY OF THE INVENTION

It is, therefore, a general object of the present invention to provide a composite static induction transistor which is capable of performing switching operations at an increased speed.

Another object of the present invention is to provide a composite static induction transistor of the type described, which is simple in structure and which can be formed easily into a small size in an IC device.

A further object of the present invention is to provide an improved integrated semiconductor device including the composite static induction transistor of the type described.

A still further object of the present invention is to provide an integrated semiconductor device of the type described, in which the control circuit for the composite static induction transistor has a carrier-supplying ability above a required level and yet is substantially free from unnecessary minority carrier storage effect.

A yet further object of the present invention is to provide an integrated semiconductor device of the type described, in which the potential level for input and/or output is selectable over a wide range.

According to one aspect of the present invention, there is provided a composite static induction transistor including a main static induction transistor and a bypath static induction transistor, all being formed in a single common semiconductor body, each of said main and said bypath transistors comprising: a source having a first conductivity type, a drain having said first conductivity type, a current channel having said first conductivity type and located between said drain and said source, and a gate having a second conductivity type opposite to said first conductivity type and located adjacent to said current channel to define a boundary of said current channel, said drain of said bypath transistor being electrically connected to said gate of said driver transistor, said gate of said bypath transistor being electrically connected to said drain of said bypath transistor, said sources of both said driver and said bypath transistors being electrically connected together. The bypath transistor may manifest a variable resistance characteristic such that, for instance, the internal resistance of the bypath transistor will decrease with an increase in the voltage applied between the drain and the source.

These and other objects as well as the features and the advantages of the present invention will become apparent from the following detailed description of the preferred embodiments when taken in conjunction with the accompanying drawings.

DETAILED DESCRIPTION OF THE PREFERRED EMBODIMENTS

The present invention concerns a composite static induction transistor and also pertains to an integrated circuit including same. The following description will be made mainly on the SITL device of IIL type for assisting the understanding of the present invention.

Figure 5:
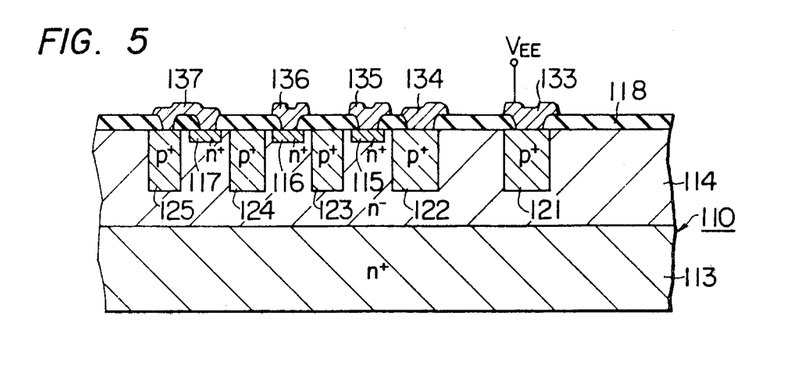
FIG. 5 is a diagrammatic vertical sectional view of an example of the SITL device embodying the present invention.

An example of the improved SITL device embodying the present invention is shown in vertical section in FIG. 5. The SITL device includes a semiconductor wafer 110 comprised of a heavily doped $n^+$ type substrate 113 and a lightly doped $n^-$ type layer 114. The semiconductor layer 114 may be formed by relying on the conventional epitaxial growth technique or diffusion technique, for instance. Alternatively, the layer 113 may be formed to be a buried region in a $p^+$ type substrate. In the semiconductor layer 114, which is made of silicon, for instance, there are provided individual highly doped $p^+$ type regions 121, 122, 123, 124 and 125. The regions 122 through 125 need to be held at a same potential, so that they are electrically connected together. In general, all of the regions 122 through 125 preferably may be formed in a continuous form such as a grid, mesh shape or stripe shape. At those locations in the semiconductor layer 114 which are surrounded by the respective regions 122 through 125, there are provided separate heavily doped $n^+$ type regions 115, 116 and 117. There are deposited ohmic electrodes 133, 134, 135 and 136 on the regions 121 through 116, respectively. Also, an ohmic electrode 137 is deposited to make ohmic connection between the two regions 124 and 125. Reference numeral 118 represents a passivation film of an insulating material such as silicon dioxide, which covers the exposed portions of the upper surface of the semiconductor layer 114.

In the embodiment of FIG. 5, the $n^+$ type layer 113 and the $n^+$ type regions 115 through 117 have an impurity concentration of $10^{18} \sim 10^{21}$ atoms/cm$^3$. The $n^-$ type layer 114 has an impurity concentration of $10^{11} \sim 10^{15}$ atoms/cm$^3$. Each of the $p^+$ type regions 121 through 125 has an impurity concentration of $10^{17} \sim 10^{21}$ atoms/cm$^3$.

Figure 6:
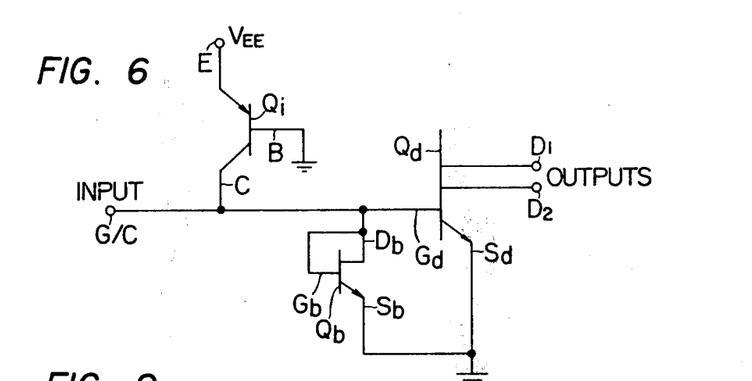
FIG. 6 is a circuit diagram showing an equivalent circuit of the SITL device of FIG. 5.

The equivalent circuit of the SITL device shown in FIG. 5 is illustrated in FIG. 6. In this Figure, reference symbol $Q_i$ represents a pnp type bipolar transistor serving as the injector transistor of the SITL device, and reference symbol $Q_d$ represents an n-channel static induction transistor employed to serve as the driver transistor. The driver transistor $Q_d$ has two separate drains $D_1$ and $D_2$, a gate $G_d$, and a source $S_d$. The injector transistor $Q_i$ has an emitter E, a collector C connected to the gate $G_d$ of the driver transistor, and a base B connected to the source of the driver transistor. In accordance with the present invention, there is introduced an additional n-channel static induction transistor $Q_b$ for providing a current path across the gate-source of the driver transistor $Q_d$. This additional transistor $Q_b$, which is hereinafter to be called a bypath (or bypass)

transistor, has a gate $G_b$ connected to the gate $G_d$ of the driver transistor $Q_d$, a drain $D_b$ connected to the gate $G_b$, and a source $S_b$ connected to the source $S_d$ of the driver transistor.

Description will now be made on the co-relationship between FIG. 5 and FIG. 6. The driver transistor $Q_d$ comprises layers 113 and 114, and regions 115, 116, 122, 123 and 124. More particularly, the layer 113 serves as the source $S_d$; the regions 122 through 124 serve as the gate $G_d$; the regions 115 and 116 serve as the drains $D_1$ and $D_2$; and those portions of the layer 114 which are surrounded by the respective regions 122 through 124 serve as separated current channels. Similarly, the bypath transistor $Q_b$ is constituted by the layer 113 serving as the source $S_b$, the region 117 serving as the drain $D_b$, the regions 124 and 125 working as the gate $G_b$, and that portion of the layer 113 which serves as the current channel and which is surrounded by the regions 124 and 125. On the other hand, the regions 121 and 122 constitute the emitter E and the collector C of the injector transistor $Q_i$. Also, a portion of the layer 114 located between the emitter and the collector serves as the base B of the injector transistor $Q_i$. As will be apparent, the collector of the injector transistor $Q_i$ and the gate of the bypath transistor $Q_b$ are merged with portions 122 and 124 the gate of the driver transistor $Q_d$, respectively, thereby being held at the same potential with that of the driver gate. Similarly, the source of the bypath transistor $Q_b$ and the base of the injector transistor $Q_i$ are held at the same potential with the source potential of the driver transistor $Q_d$.

The operation of the afore-mentioned SITL embodying the present invention will be explained below.

Suppose now that a certain voltage $V_{EE}$ is continuously applied to the emitter E of the injector transistor $Q_i$ to render the transistor conductive, and that a certain external device (not shown) is connected across the gate $G_d$ and the source $S_d$ of the driver transistor $Q_d$.

If the external device in the preceding stage is turned "on" and the current supplied from the conductive injector transistor all flows into the external device, the gate of the driver transistor is held substantially at the low level voltage such as 0.1~0.2 V, for instance. Under this condition, both the driver transistor and the bypath transistor are rendered to the "off" state, because the current channels of these transistors are pinched-off by the gate-channel depletion layers, and high potential barriers are thus developed in the current channels. In other words, the static induction transistors $Q_d$ and $Q_b$ are designed so that the gate-channel diffusion potential difference may cause the gate-channel depletion layers extending from the gate to spread completely across the current channel. The higher the impurity concentration of either the gate or the current channel is, and the more abrupt the impurity concentration change at the boundary between the gate and the current channel is, the larger the gate-channel diffusion potential difference becomes. As the gate-channel diffusion potential difference increases, the static induction transistor logic will be able to have a wider logic voltage swing.

It should be noted here that the bypath transistor has the gate coupled to the drain, and that accordingly this bypath transistor exhibits a voltage-current characteristic wherein the drain current will non-linearly increase with an increase in the drain-source voltage. This voltage-current characteristic is dependent mainly upon the ratio of the distance between the drain and the intrinsic gate, (i.e. the extreme point of the potential barrier induced in the current channel) to the distance between said intrinsic gate and the source. In general, when the value of the above ratio is a greater one, the bypath transistor will exhibit a more gentle incrementation in the drain current for an increase in the drain-source voltage. In the SITL device of the present invention, the voltage-current characteristic of the bypath transistor is such in such a way that, when the driver gate potential, i.e. the drain potential of the bypath transistor, is increased to a predetermined potential $V_{go}$ capable of holding the driver transistor conductive, the bypath transistor becomes conductive to allow the majority of the current supplied by the injector transistor to flow through this bypath transistor while allowing an adequate part of the current to flow into the gate of the driver transistor.

In this discussion, however, let us suppose that the bypath transistor has a voltage-current characteristic similar to that of a constant-voltage diode. More particularly, let us suppose that the bypath transistor will remain substantially non-conductive for a drain voltage lower than the predetermined gate voltage $V_{go}$ of the driver transistor, but becomes conductive in response to drain voltages greater than or equal to the predetermined gate voltage $V_{go}$, thus keeping the drain-source voltage thereof almost constant. The above voltage $V_{go}$ is about 0.5~0.8 V in case the SITL device is formed with silicon.

Next, the description will be made on the operation of the afore-mentioned embodiment when the external device in the preceding stage is turned off. Upon turning the external device off, the current, which is an almost constant current and is supplied from the injector transistor, begins to flow toward the gates of the driver and bypath transistors. At the onset, almost all of the current supplied will flow into the gate capacitance of the driver transistor, because the potential at the driver transistor gate still remains very low. Accordingly, the gate capacitance is rapidly charged up, with the result that the gate potential is quickly raised to the predetermined gate potential $V_{go}$. As a result, the driver transistor is turned "on" immediately after the turning-off of the preceding stage external device. At substantially the same time that the driver transistor turns on, the voltage at the drain of bypath transistor $Q_b$ becomes greater or equal to $V_{go}$ and the bypath transistor will become conductive. Therefore, a large part of the current supplied from the injector transistor is bypassed through the bypath transistor and thus only a small further increase in the driver gate potential is allowed.

As described above, once the driver transistor has been turned "on", the driver gate potential is substantially prevented from making a further increase, due to the action of the bypath transistor. Thus, little, if any, unnecessary excessive minority carrier injection into the current channel of the driver transistor or unrequired injection of minority carriers into any high resistivity region located adjacent to the gate other than the current region of the driver transistor, will occur. As a result, the minority carrier storage effect which would take place at the driver transistor is minimized while securing an increased speed of the turning-on action of the driver transistor. It should be noted here that an adequately small amount of minority carriers is constantly injected from the gate into the current channels of the driver transistor to hold the driver transistor in the conducting state. Therefore, the voltage-current characteristic of the bypath transistor must meet the above requirement for the driver transistor. Namely, the internal resistance of the bypath transistor in the conductive state must be held relatively higher than that of the driver transistor in the conducting state. This condition may be accomplished by setting the width of the current channel of the bypath transistor slightly smaller than that of each of the current channels of the driver transistor. Alternatively, for the same purpose, the impurity concentration of the bypath transistor channel may be set slightly lower than that of the current channels of the driver transistor. In short, the bypath transistor should be designed so that a slightly higher potential barrier may be induced in its current channel than those induced in the current channels of the driver transistor.

When the preceding stage external device is turned "on" again, the driver transistor will immediately turn "off" because of the minimized minority carrier storage effect in the driver transistor.

Figure 7:
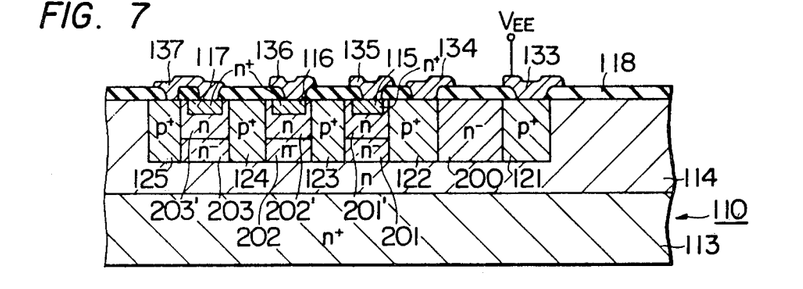
FIGS. 7 and 8 are diagrammatic vertical sectional views of different examples of the SITL device embodying the present invention, respectively.

A modification of the SITL device of FIG. 5 is shown in vertical section in FIG. 7. In this example, the impurity concentration of those portions 200, 201, 202 and 203 which serve actually as the base of the injector transistor and the current channels of the driver and bypath transistors, is set to be lower than that of the remaining portions in the layer 114 excepting the gates 122 through 125 and the emitter 121. For instance, the former impurity concentration is set to be about $10^{11} \sim 10^{15}$ atoms/cm$^3$ and the latter impurity concentration is determined to be about $10^{15}$ atoms/cm$^3$ or more. With this arrangement, the minority carriers are injected mainly into the real current channel regions 201 through 203 from the gate regions 122 through 125, and also effectively into the base region 200 from the emitter region 121. Because the diffusion potential difference is large, the injection of holes from the p$^+$ type gate regions 122~125 into the n type regions 201'~203' which are located between the n$^-$ type regions 201~203 and the n$^+$ type regions 115~117, respectively, is not very intensive. In other words, this arrangement provides a reduction in the unnecessary injection of minority carriers into those high resistivity regions other than the real current channels and the base, and to a further reduction in the minority carrier storage effect in the SITL device.

Needless to say, as the gate regions of the driver transistor are made smaller, the gate capacitance as well as the minority carrier storage effect of the driver transistor become all the more reduced. Therefore, in the embodiments of FIGS. 5 and 7, the known ion-implantation technique preferably is applied for forming the gate regions small in size.

Figure 8:
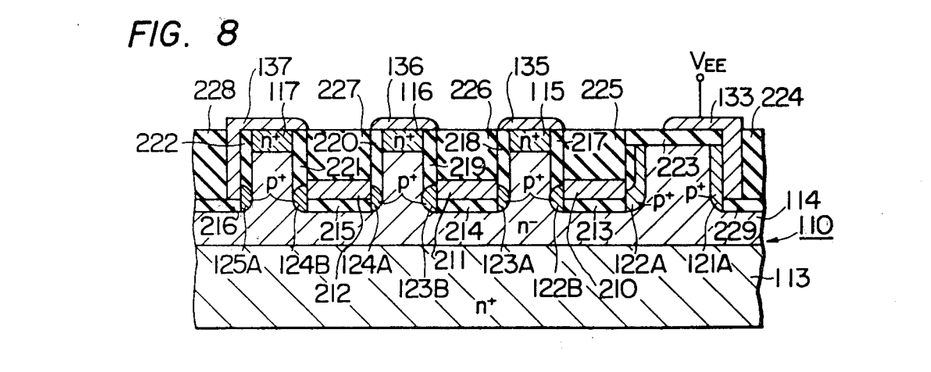

A still another modification of the SITL device of FIG. 5 is illustrated in vertical section in FIG. 8, in which the gates of both the driver transistor and the bypath transistor are formed into minute p$^+$ type regions 122B, 123A, 123B, 124A, 124B and 125A, and in which the collector of the injector transistor is formed as a p$^+$ type region 122A separated from the gate region 122B. All of the respective gate (or collector) regions 122A, 122B, . . . , 125A are electrically and mutually connected to conducting layers 210, 211 and 212 of a conducting material such as aluminum, molybdenum, low-resistivity polysilicon and so forth. The conducting layers 210, 211 and 212 are isolated from the high resistivity layer 114 as well as from the drain regions 115, 116 and 117 by insulating layers 213 through 223 of an insulator material such as SiO$_2$, Si$_3$N$_4$, Al$_2$O$_3$ and a combination of any of these materials, thus providing the so-called step-cut structure having recesses. Reference numerals 224 through 228 represent insulating layers, respectively, of an insulator material such as SiO$_2$, Si$_3$N$_4$, Al$_2$O$_3$, high-resistivity polysilicon, polyimide resin and so forth. The electrode 137 separated from the high resistivity layer 114 and from the drain region 117 by the insulating layers 216, 222 and 228, and similarly the electrode 133 is separated from the high resistivity layer 114 by the insulating layers 223, 224 and 229.

This embodiment can provide a further improved operation characteristics as will be described below in detail. Each of the gate regions 122B, . . . , 124A can be easily formed as a heavily-doped region with minute dimensions using the selective diffusion technique prior to the formation of the insulating layers 225, . . . , 227 and the conducting layers 210, . . . , 212. In addition, those portions of the gate regions not in contact with the effective current channels are covered with the insulating layers to thereby be separated from any adjacent high-resistivity region of the layer 114. Therefore, the gate capacitance of the driver transistor can be greatly minimized. Moreover, almost all of the carriers injected into the gate regions from the emitter of the injector transistor are drawn exclusively into the current channels, so that the minority carrier storage effect of the driver transistor is greatly reduced. Minority carriers are injected only to the channel, and this is effective in reducing the source to drain resistance of the driver transistor. Furthermore, the emitter 121A and the collector 122A may be formed easily with a small distance left therebetween, by relying on the selective diffusion technique for forming these regions prior to the formation of the insulating layers 224, 225, 223 and 229 and the electrode 133, with the result that an increased current transfer factor (base-grounded current gain) develops in the injector transistor. For those reasons described above, the driver transistor in the SITL device of FIG. 8 can perform switching actions (turn-on as well as turn-off actions) at a greatly increased speed.

As described above, according to the present invention, an improved SITL device which is superior in the operation speed to the prior art STIL device can be obtained. The composite SIT of the present invention includes an additional transistor, i.e. a bypath transistor for suppressing the occurrence of the unrequired excessive carrier injection at the current channels of the main transistor. However, the bypath transistor is formed as a static induction transistor, so that the SITL device embodying the present invention may be manufactured using a simple process with a high integration density substantially comparable to that of the prior art SITL device.

Additionally speaking, in the aforementioned embodiments, the operation speed may be further enhanced by providing, on the source region (low resistivity layer 113), projections extending toward the corresponding current channels, as disclosed in Japanese Patent Application No. 51-143698 (corresponding U.S. Pat. No. 4115793 by Jun-ichi NISHIZAWA). This modification will result in a reduction in the series resistance as well as in the carrier transit time between the source and the drain, and also result in an increased trans-conductance. The carrier transit time from the source to the drain becomes important in a very high-speed static induction transistor having very little storage of unnecessary minority carriers and having very small time constants for charging and discharging the gate. The drain voltage in the "on" state of the transistor is very small, for example 0.1 V, hence the source-to-drain distance will be no greater than 3 $\mu$m (micrometers) to realize a carrier transit time of 1 nanosecond or less. This will lead to an increase in the operation speed of the driver transistor. Moreover, a further reduction in the storage effect in the driver transistor may be attained by bringing the gate of the driver transistor into a substantial contact with the source. It should also be understood that all of the respective semiconductor layers or regions in the SITL device may be reversed in their conductivity types. Furthermore, the injector bipolar transistor may be replaced by a junction-type or MOS-type field effect transistor having a saturated drain voltage vs. drain current characteristic like a bipolar transistor. Furthermore, the number of the drains or the current channels of the driver transistor may be changed as required. Also, the driver transistor could be replaced by a field effect transistor.

Figure 9:
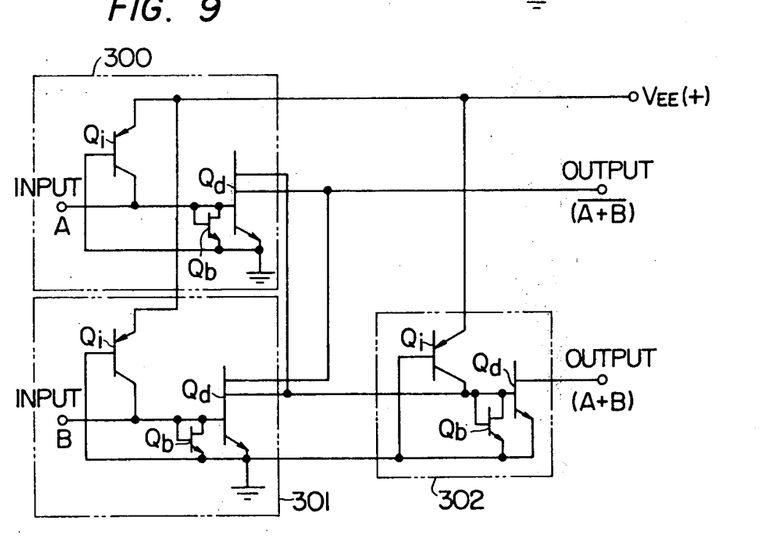
FIG. 9 is a circuit diagram showing an equivalent circuit of an example of the wired logic circuit constructed with several SITL devices embodying the present invention.

An example of the logic circuit constructed by interconnecting several SITL devices of the present invention is illustrated in FIG. 9. This circuit includes three circuit units 300, 301 and 302 each of which is comprised of an SITL device of the present invention such as those shown in FIGS. 5, 7 and 8, but the driver transistor $Q_d$ of the STIL device 302 has only one drain. The respective SITL devices 300, 301 and 302 may be formed in a discrete fashion, or they may be formed integrally in a single common semiconductor wafer. The emitters of the injectors $Q_i$ in the respective SITL devices 300, 301 and 302 are connected to a line applied with a constant voltage $V_{EE}$ (positive). The sources of the driver transistors $Q_d$ in the respective SITL devices are grounded. The drains of the driver transistors $Q_d$ in the SITL devices 300 and 301 are mutually wired. Two input signals, A and B, respectively are applied to the gates of the driver transistors $Q_d$ in the SITL devices 300 and 301.

When both input signals assume the logical "0" level (e.g. the low level voltage), the driver transistors $Q_d$ of the SITL devices 300 and 301 assume the "off" state, and then the driver transistor $Q_d$ in the SITL device 302 assumes the "on" state. If both input signals A and B are at the logical "1" level (the high level voltage), the driver transistors of the SITL devices 300 and 301 turn "on", so that the driver transistor of the SITL device 302 is turned "off". If the input signal B is at the logical "1" level, but the input signal A is at the logical "0" level, the driver transistor of the SITL device 301 is turned "on" while the driver transistor of the SITL device 300 is turned "off". Accordingly, in this condition, the driver transistor of the SITL device 302 is in the "off" state. In short, the drain of the driver transistor in the SITL device 302 provides the logical sum (OR) of the two inputs A and B. On the other hand, the inverted logical sum (NOR) of inputs A and B is obtained at the respective drains of the driver transistors in the SITL devices 300 and 301.

The present invention has been described with respect to an SITL device, but it is not limited thereto. The composite SIT as described above can be used in various types of integrated circuit and also as a discrete element for high-speed operation use.

Furthermore, the present invention can be also embodied in an insulated-gate static induction transistor. Namely, a multi-drain insulated-gate static induction transistor may be formed, and one of the drains may be connected to the gate electrode thereof.

What is claimed is:

1. A composite static induction semiconductor device comprising:
   a first and a second static induction transistor, both of which being formed in a single common semiconductor body,
   said first transistor including:
   a first semiconductor layer; a heavily-doped source semiconductor region having a first conductivity type and provided in said first semiconductor layer; a heavily-doped drain semiconductor region having said first conductivity type and provided in said first semiconductor layer; a current channel having said first conductivity type and provided in said first semiconductor layer between said drain and said source; and a heavily-doped gate semiconductor region having a second conductivity type opposite to said first conductivity type and provided adjacent to said current channel to define a boundary of said current channel,
   said second transistor including: a second semiconductor layer; a heavily-doped source semiconductor region having said first conductivity type and provided in said second semiconductor layer; a heavily-doped drain semiconductor region having said first conductivity type and provided in said second semiconductor layer; a second current channel having said first conductivity type and provided in said second semiconductor layer between said second transistor drain and source; and a heavily-doped gate semiconductor region having said second conductivity type and located adjacent to said second current channel to define a boundary of said second current channel,
   said gate of said second transistor being electrically connected to both said drain of said second transistor and said gate of said first transistor, said second transistor having a variable internal resistance versus drain-source voltage characteristic, said sources of said both transistors being electrically connected to each other and being formed in a portion of said single common semiconductor body.

2. A composite static induction semiconductor device according to claim 1, in which: both said first and second semiconductor layers are merged into a single common semiconductor body.

3. A composite static induction semiconductor device according to claim 2, in which: said sources of both said first and second transistors are merged into a single common semiconductor region having said first conductivity type.

4. A composite static induction semiconductor device according to claim 2, in which: said gate of said second transistor is formed continuous to said gate of said first transistor.

5. A composite static induction semiconductor device according to claim 1, in which: said current channel of said first transistor comprises a first semiconductor region contacting a particular portion of said gate of said first transistor, and a second semiconductor region contacting a portion of said gate of said first transistor excluding said particular portion, and in which: said first semiconductor layer has said first conductivity type, said first semiconductor region having an impurity concentration lower than those of said second semiconductor region and of said first semiconductor layer.

6. A composite static induction semiconductor device according to claim 5, in which: said current channel of said second transistor comprises a third semiconductor region contacting a certain portion of said gate of second transistor, and a fourth semiconductor region contacting a portion of said gate of said second transistor excepting said certain portion, and in which: said second semiconductor layer has said first conductivity type, said third semiconductor region has an impurity concentration lower than those of said fourth semiconductor region and of said second semiconductor layer.

7. A composite static induction semiconductor device according to claim 1, in which: those portions of said gate of said first transistor other than a particular portion thereof are covered with insulator layers and a conducting electrode, said gate of said first transistor contacting, only at said particular portion thereof, said current channel of said first transistor.

8. A composite static induction semiconductor device according to claim 7, in which: those portions of said gate of said second transistor other than a particular portion thereof are covered with insulator layers and a conducting electrode, said gate of said second transistor contacting, only at said particular portion thereof, said current channel of said second transistor.

9. A composite static induction semiconductor device according to claim 1, in which: said first semiconductor layer has a recess provided therein and opening outwardly at a surface of the layer, said gate of said first transistor extending from a particular portion of the inner surface of said recess into said first semiconductor layer.

10. A composite static induction semiconductor device according to claim 9, in which: said semiconductor layer has a recess provided therein and opening outwardly at a surface at a surface of the layer, said gate of the second transistor extending from a particular portion of the inner surface of the recess into the second semiconductor layer.

11. A composite static induction semiconductor device according to claim 10, in which: both said recesses in said first and second semiconductor layers are formed into a common recess, and said gate of said first transistor is connected to said gate of said second transistor by a conducting layer provided in said common recess.

12. A composite static induction semiconductor device according to claim 1, 2, 3, 4, 5, 6, 7, 8, 9, 10, or 11 in which: the distance between the source and the drains of said first transistor is 3 micro-meters at most.

13. A composite static induction semiconductor device comprising:

a semiconductor substrate of a first conductivity type and a low resistivity having a first and a second main surface;

an epitaxial semiconductor layer of said first conductivity type and a high resistivity formed on said second main surface of said substrate and forming a third main surface;

a first semiconductor region of a low resistivity and a second conductivity type opposite to said first conductivity type formed in said third main surface of the epitaxial semiconductor layer and having a plurality of apertures penetrating therethrough for forming a mesh structure;

a plurality of current channels provided in part of said epitaxial semiconductor layer between said apertures and said substrate having said first conductivity type and high resistivity;

a plurality of second semiconductor regions of a low resistivity and said first conductivity type formed in said apertures of said first semiconductor region; and respective electrodes formed on said substrate, said first semiconductor region and said second semiconductor regions, one of the electrodes on said second semiconductor region extending onto said first semiconductor region and contacting therewith;

said substrate, said epitaxial layer, said first semiconductor region and said second semiconductor region constituting a source, a channel, a gate and a drain of a static induction transistor.

14. A composite static induction semiconductor device according to claim 13, in which: the distance between said substrate and said second semiconductor regions is 3 micrometers at most.

15. A static induction semiconductor device comprising:

a semiconductor substrate of a first conductivity type and a low resistivity having a first and a second main surface;

an epitaxial semiconductor layer of said first conductivity type and a high resistivity being formed on said second main surface of the substrate and forming a third main surface;

a plurality of first semiconductor regions of a low resistivity and a second conductivity type opposite to said first conductivity type being formed on said third main surface of the epitaxial semiconductor layer, and insulating layers being formed on each of said first semiconductor regions opposite to said epitaxial semiconductor regions for forming an insulated gate structure;

a plurality of second semiconductor regions of a low resistivity and said first conductivity type formed on said third main surface of epitaxial semiconductor layer, surrounded by said first semiconductor regions;

a plurality of current channels of a high resistivity and said first conductivity type provided in said epitaxial semiconductor layer between each of said second semiconductor regions and said substrate; and respective electrodes formed on said substrate, said insulating layers and said second semiconductor regions, one of the electrodes on said insulating layers extending onto said second semiconductor region and contacting therewith;

said substrate, said epitaxial layer, said first semiconductor regions and said insulating layers, and said second semiconductor regions constituting a source, channels, insulated-gates and drains of a static induction transistor device.

16. In an integrated circuit device of the type comprising an injector transistor and a driver transistor, each having first and second elements defining a controlled current path therebetween, and a control element for controlling current flow through said current path, said driver transistor being rendered conductive in response to voltages at said driver control element at least equal to a predetermined voltage, said driver transistor conductive state having a first resistance associated therewith, said driver control element having a capacitance associated therewith, said injector transistor being coupled to said driver transistor to selectively provide minority carriers to said driver control element to charge said capacitance to said predetermined value and render said driver transistor conductive;

said injector transistor tending to inject excessive minority carriers into said driver control element and deleteriously affecting the switching of said driver transistor between conductive and non-conductive states, the improvement wherein said device further includes:

a bypath static induction transistor, having first, second, and gate elements and a semiconductor channel region, said first and second elements defining a controlled bypath current path therebetween through said channel region, said gate element being disposed adjacent to said channel region and generating depletion layers extending from said gate element into said channel region to at least nearly pinch off said bypath current path, in the absence of a bias voltage applied to said bypath transistor gate element; said bypath gate element and said bypath first element being electrically connected to said driver control element, and said bypath second element being coupled to said driver second element, whereby said bypath current path becomes conductive in response to voltages of at least said predetermined value applied to said driver control electrode, said bypath transistor having a second resistance, higher than said first resistance, associated with the conductive state thereof, such that said excessive minority carriers are shunted through said bypath current path after said driver control element capacitance charges to said predetermined value.

17. A static induction device comprising:

first and second static induction transistors (SIT's) each having first and second and gate elements and a channel semiconductor region, said first and second elements defining a controlled current path therebetween through said channel region, said current path having a predetermined resistance associated therewith when conductive, said gate element being disposed proximate to said channel region to generate a depletion extending into said channel region to selectively render said current path non-conductive, and rendering said current path conductive in response to voltages at least equal to a predetermined value;

said second SIT gate and first elements being electrically connected to said first SIT gate element, and said second element of said first SIT and second element of said second SIT being connected together;

said second SIT current path resistance being greater than said first SIT current path resistance.

18. A static induction device formed in a semiconductor body having at least a first principle surface, said device comprising:

a substrate of a first semiconductor conductivity type and of low resistivity, formed in said body removed from said principal surface;

a semiconductor layer of said first conductivity type and of high resistivity formed adjacent to said substrate;

at least first and second semiconductor regions of said first conductivity type and of low resistivity, disposed spaced apart in said semiconductor layer adjacent to said principal surface;

said first region defining a main controlled current path between said first region and said substrate having a first resistance associated with the conductive state thereof;

said second region defining a bypath current path between said second region and said substrate, having a second resistance, greater than said first resistance, associated with the conductive state thereof;

a third semiconductor region of a second conductivity type opposite to said first conductivity type and a low resistivity, having respective electrically connected portions disposed proximate to said main and bypath current paths, to generate depletion layers extending into said current paths to render said current paths conductive in response to voltages at said third semiconductor region at least equal to a predetermined value, and render said current paths non-conductive in response to voltages at said third region less than said predetermined to voltages at said third region less than said predetermined value, said third semiconductor region being electrically connected to said second semiconductor region.

* * * * *